United States Patent [19]

Rao

[11] 4,388,121
[45] Jun. 14, 1983

[54] REDUCED FIELD IMPLANT FOR DYNAMIC MEMORY CELL ARRAY

[75] Inventor: G. R. Mohan Rao, Houston, Tex.

[73] Assignee: Texas Instruments Incorporated, Dallas, Tex.

[21] Appl. No.: 132,703

[22] Filed: Mar. 21, 1980

[51] Int. Cl.³ ................. H01L 21/263; G11C 11/40; G11C 17/00

[52] U.S. Cl. ........................ 148/1.5; 29/571; 29/576 B; 148/187; 357/23; 357/91

[58] Field of Search ............... 148/1.5, 187; 357/23, 357/23 VT, 91; 29/571, 576 B

[56] References Cited

U.S. PATENT DOCUMENTS

| | | | |
|---|---|---|---|
| 3,996,658 | 12/1976 | Takei et al. | 29/571 |
| 4,033,026 | 7/1977 | Pashley | 29/571 |
| 4,055,444 | 10/1977 | Mohan Rao | 148/1.5 |
| 4,125,933 | 11/1978 | Baldwin | 29/571 |
| 4,140,547 | 2/1979 | Shibata et al. | 357/91 |
| 4,145,803 | 3/1979 | Tasch, Jr. | 29/571 |
| 4,230,504 | 10/1980 | Kuo | 29/571 |
| 4,240,092 | 12/1980 | Kuo | 357/91 |
| 4,240,195 | 12/1980 | Clemens et al. | 29/571 |
| 4,258,466 | 3/1981 | Kuo et al. | 29/571 |
| 4,277,882 | 7/1981 | Crossley | 29/571 |
| 4,280,271 | 7/1981 | Lou et al. | 29/571 |

OTHER PUBLICATIONS

Sakamoto et al. Jap. Jour. Appl. Phys. 18 (1979) Suppl. 18-1, pp. 85-91.

Primary Examiner—Upendra Roy
Attorney, Agent, or Firm—John G. Graham

[57] ABSTRACT

A dynamic read/write memory cell of the one-transistor N-channel silicon gate type is made by a double-level polysilicon process in which the implant dosage is reduced for the channel stop regions beneath the field oxide. This causes the signal level on the bit lines to be improved, and also reduces leakage problems.

9 Claims, 10 Drawing Figures

REDUCED FIELD IMPLANT FOR DYNAMIC MEMORY CELL ARRAY

BACKGROUND OF THE INVENTION

This invention relates to semiconductor memory devices and methods of manufacture, and more particularly to an improved method for making a one-transistor dynamic read/write memory device of the N-channel silicon gate type.

Dynamic read/write memory cells made by the single-level or double-level polysilicon N-channel self-aligned processes commonly used in the industry are shown in my U.S. Pat. No. 4,055,444 as well as in pending U.S. patent applications Ser. No. 648,594, filed Jan. 12, 1976 and Ser. No. 722,841, filed Sept. 13, 1976, by C-K Kuo, all assigned to Texas Instruments; these processes are also shown in Electronics: Feb. 19, 1976, pp. 116-121: May 13, 1976, pp. 81-86; and Sept. 28, 1978, pp. 109-116.

In prior dynamic RAM cell arrays, the "bit" lines (Y or column input/output lines) are usually formed of elongated N+ diffused silicon regions. The capacitance of these bit lines formed of diffused silicon is a continuing problem in large arrays, especially as the capacitor sizes are scaled down for maximum density. One of the most common failure modes in high density dynamic RAMs is that of an inadequate signal level on the bit lines caused by a small storage capacitor to bit line capacitance ratio. This failure mode can be reduced by increasing the supply voltage, by delaying the sensing clock which operates the sense amplifiers, or of course by increasing the area of the storage capacitors or decreasing the capacitor dielectric thickness. These solutions are limited by bar size, access time, cost and yield constraints.

One of the principal contributing factors to the bit line capacitance is the capacitance between the diffused N+ bit line region and the P+ channel stop at the sidewalls. Reduction in this factor by reducing the implant dosage which forms the channel stop will result in an enhanced signal level while still producing an adequately high field threshold voltage. Moreover, the refresh characteristics are improved significantly, especially for the logic 1 state, because the majority of the leakage current is associated with the field implant. Reducing sidewall capacitance has other associated benefits, like improved speed as well as reduced PN junction capacitive loading in the periphery.

It is the principal object of this invention to provide an improved dynamic read/write memory. Another object is to provide a dynamic memory cell array of reduced cell size yet high signal output level. An additional object is to provide a dense array of DRAM memory cells, made by an improved method which provides a reduction in sidewall capacitance for bit lines.

SUMMARY OF THE INVENTION

In accordance with an illustrative embodiment of the invention a dynamic read/write memory cell of the one transistor N-channel silicon gate type is made by a double-level polysilicon process in which the implant dosage is reduced for the channel stop regions beneath the field oxide. This causes the signal level on the bit lines to be improved, and also reduces leakage problems.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENTS

Figure 1:
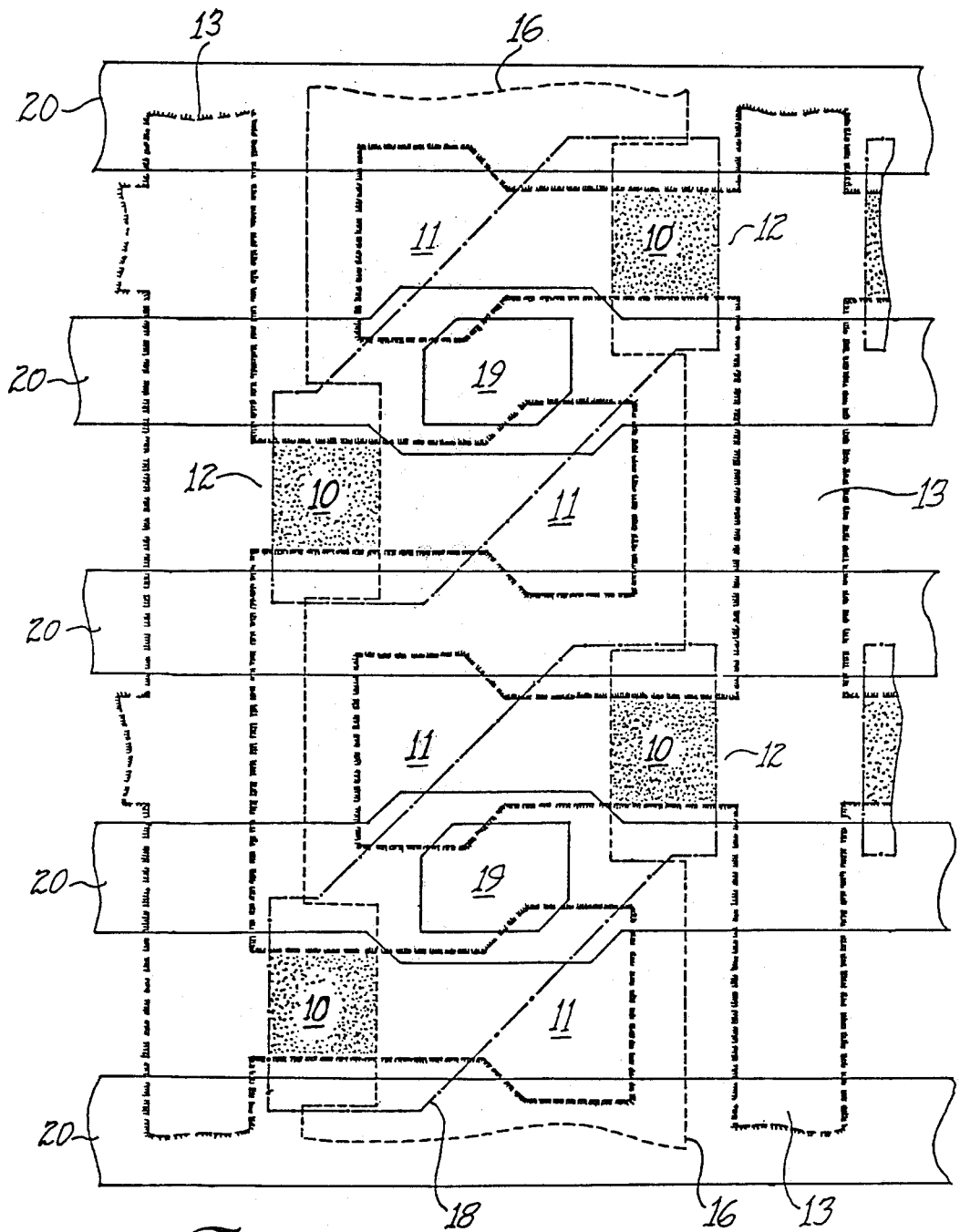
FIG. 1 is a greatly enlarged plan view of a small portion of a semiconductor chip showing the physical layout of a part of a dynamic memory cell array which may be made according to the invention.

With reference to FIGS. 1, 2, and 3a-3d, an array of one-transistor dynamic memory cells is illustrated which may be made according to the invention. Each memory cell includes an MOS access transistor 10 and an MOS capacitor 11. Each access transistor has an N+ source (or drain) region 12 which is part of one of a large number of elongated column or bit lines 13 formed by N+ diffused regions in the face of the silicon bar. The capacitors 11 include inverted regions 15 in the surface of the silicon created by a Vcc voltage, about 5 v, on first level polycrystalline silicon strips 16 which extend along the columns. The gates 17 of the access transistors 10 are formed by second level polycrystalline silicon segments 18, each of which forms gates for two of the transistors. The segments 18 extend over the first level polysilicon to provide contact areas 19 where connection is made to metal row or word lines 20. Each contact area 19 is shared by two cells. No contact area 19 is seen for alternate ones of the lines 20 in FIG. 1 since contact areas for such lines will be between the next pair of columns.

The first level polysilicon strips 16 are separated from the silicon in the area of the capacitors 15 by a thin thermal oxide coating 21, and a similar silicon oxide coating 22 separates the gates 17 from the silicon at the transistors 10 as well as separating the remainder of the second level poly segments 18 from the first level poly. A thick layer 23 of deposited oxide separates the polysilicon layers from the metal lines 20. A thick layer of thermal silicon oxide 24 surrounds all of the moat areas on the face of the silicon bar; that is, all areas not occupied by the transistors 10, capacitors 11 and bit lines 13 are covered by this field oxide 24.

According to the primary feature of the invention, channel stop regions 25 underlying all of the field oxide are doped at a level which will eliminate or reduce problems which have previously plagued dynamic memory devices of this type, as explained below in more detail.

Figure 2:
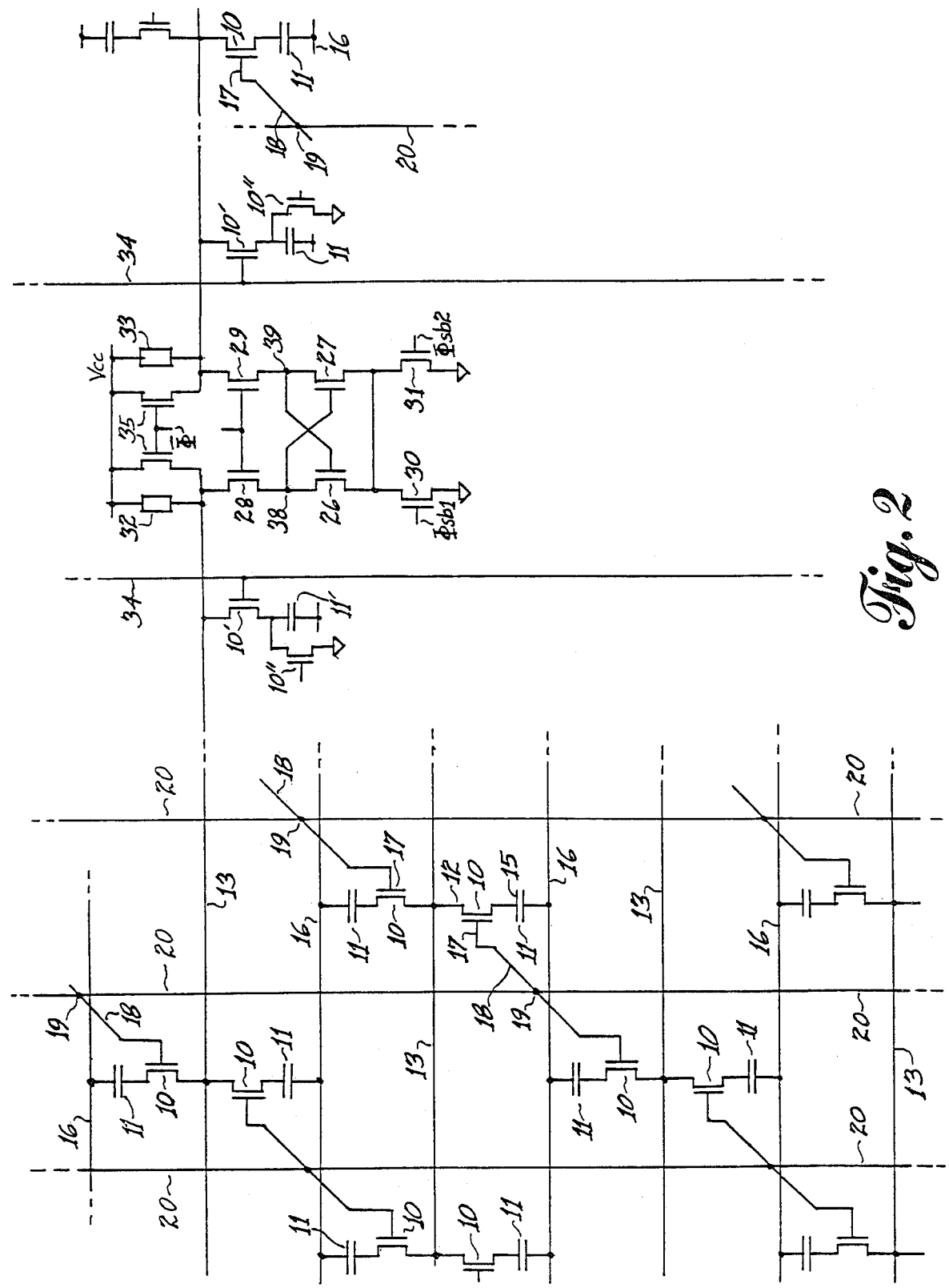
FIG. 2 is an electrical schematic diagram of the part of the cell array of FIG. 1.
Figure 3:
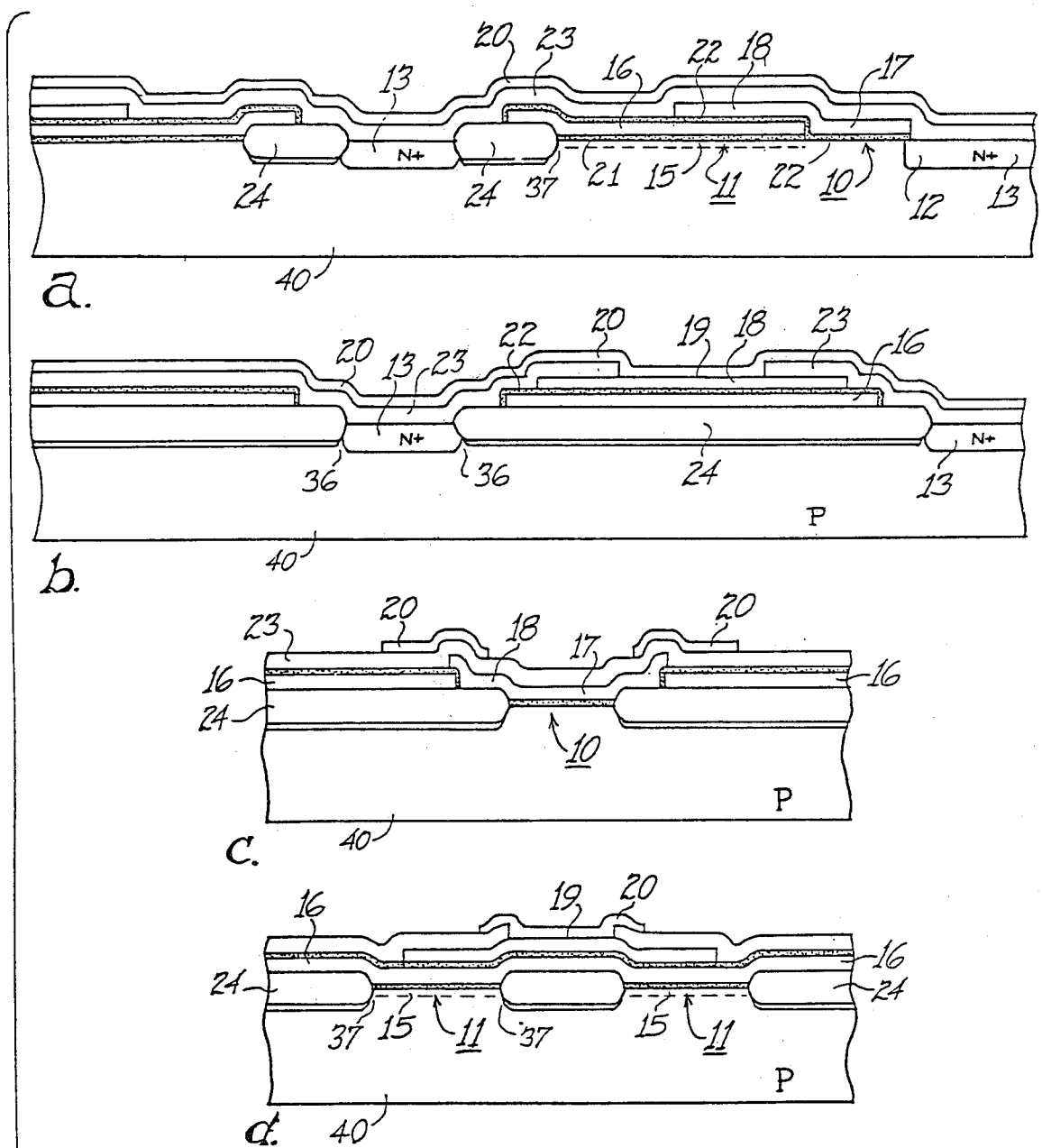
FIGS. 3a-3d are elevation views in section of the cells of FIG. 1, taken along the lines a—a, b—b, c—c, and d—d, respectively.

The cell array, of which FIG. 1 is a small part, would typically contain perhaps 64K or 256K cells on a silicon bar which is about 160 mils on a side or about 25,000 sq. mil area, depending upon the bit density. The four cells shown would be on a minute part of the bar, perhaps one or two mils wide. A 64K RAM would require 256 of the X address lines or row lines 20, and 256 of the bit or Y lines 13, providing 65,536 bits. As seen in FIG. 2, the bit lines 13 are connected to opposite sides of a differential sense amplifier which employs a pair of driver transistors 26, 27 and coupling transistors 28, 29; grounding transistors 30 and 31 connect the sources of the driver transistors to Vss at $\Phi sb1$ and $\Phi sb2$. Active load devices 32 and 33 connect the bit lines 13 to the supply voltage Vcc which is 5 v in this case. A dummy cell with an access transistor 10', a capacitor 11' and a discharge transistor 10'' is provided on each side of each sense amplifier; when a cell on one side is addressed by a word line 20, a dummy cell address line 34 on the opposite side is activated. The bit lines 13 are precharged during $\Phi$ by transistors 35. This cell array and sense amplifier is shown in Electronics, Sept. 28, 1978, pp. 109-116 and copending application Ser. No. 944,822, filed Sept. 22, 1978, now U.S. Pat. No. 4,239,993, by McAlexander, White and Rao, assigned to Texas Instruments.

A very critical factor in sensing the voltage charge on a bit line 13 in the dynamic RAM shown is the ratio of the capacitance of a capacitor 11 in a storage cell to the capacitance of the bit line 13. The available signal level at the input of the sense amplifier is directly related to this ratio. The capacitance of the storage cell capacitor 11 has two components. About 90% is due to the MOS capacitor formed by the plate 16 along with the silicon oxide 21 and inverted region 15. The other 10% is due to the junction capacitance, both that from the inverted surface region 15 to the bulk silicon and that around the periphery between the inverted regions 15 and the channel stop 25. The capacitance of the N+ diffused bit line 13 has several components; the capacitance to the bulk silicon; the capacitance associated with the sidewalls or periphery junction capacitance such as at the locations 36 in FIG. 3b; and the coupling capacitance through the thick oxide 23 to the metal word line 20 (see FIG. 3b). In the conventional N-channel process for making dynamic RAMs, the sidewall capacitance is about 30 to 40% of the total capacitance of a bit line 13 when the bit line is about 5 to 6 microns wide (after taking into account lateral N+ diffusion) and is almost 50 to 60% for a 2 to 2.5 micron bit line. The capacitance of a junction is inversely related to the square root of the effective corner concentration. Hence, by decreasing the field implant which creates the channel stop 25 from a dosage of $4 \times 10^{12}$ per cm. sq. down to about $3 \times 10^{12}$, the bit line capacitance is effectively reduced by about 10%, and the signal level improves by about the same ratio. This is sufficient to make a marked difference in the column output reliability.

The damage done to the silicon surface due to ion implantation is directly proportional to the dosage, and is somewhat indirectly related to the energy. This damage can be partly annealed out by a high temperature operation in an inert atmosphere prior to growing field oxide 24, as set forth in my U.S. Pat. No. 4,055,444. However, the damage causes significant junction leakage at the locations 37 of FIGS. 3a and 3d, not only causing precharge problems in bit lines 13 but also causing degradation in refresh time, expecially for stored "1" levels.

Reducing the implant dosage for the channel stop regions 25 also reduces the sidewall capacitance in the bar in nodes peripheral to the cell array, resulting in reduced capacitive loading on dynamic nodes involved in clock circuits and the like. This can improve access time and reduce power dissipation, expecially when interlocked clock schemes are employed.

Furthermore, reducing the sidewall capacitance by reducing the implant dosage for the channel stop regions 25 also speeds up the sensing operation in the cross-coupled sense amplifier of FIG. 2 by reducing the capacitive loading on the sense rodes 38 and 39. These are the critical nodes and are created by N+ diffusions forming the source/drain regions of the driver and coupling transistors 26-29. The lower the capacitance of these nodes, the faster the nodes can change in voltage.

Reduced sidewall capacitance also increases the junction breakdown voltage throughout the bar, providing more protection for nodes storing high voltages such as the bootstrap devices used in output buffer circuits.

Turning now to FIGS. 4a-4d, a process for making the DRAM cell array according to the invention will be described. The starting material is a slice of P-type monocrystalline silicon, typically four inches in diameter and twenty mils thick, cut on the <100> plane, of a resistivity of about 6 to 8 ohm-cm. As mentioned above, in the FIGURES the portion shown of the bar 40 represents only a very small part of the slice, perhaps one or two mils wide. After appropriate cleaning, the slice is oxidized by exposing to oxygen in a furnace at an elevated temperature of perhaps 1100° C. to produce an oxide layer 41 over the entire slice of a thickness of about 1000 Å. Next, a layer 42 of silicon nitride of about 1000 Å thickness is formed over the entire slice by exposing to an atmosphere of dichlorosilane and ammonia in a reactor. A coating of photoresist is applied to the entire top surface of the slice, then exposed to ultraviolet light through a mask which defines the desired pattern of the thick field oxide 24 and the P+ channel stops 25. The resist is developed, leaving areas where nitride is then removed by etching the exposed part of the nitride layer 42 but leaving in place the oxide layer 41.

Using photoresist and nitride as a mask, the slice is subjected to an implant step according to the invention to produce the channel stop regions; to this end boron atoms are introduced by ion implant into unmasked regions 43 of silicon.

Heretofore, an implant dosage of about $4 \times 10^{12}$ per sq. cm. has been used, but according to the invention, dosage is reduced to about 2.5 to $3 \times 10^{12}$ boron atoms per sq. cm. The energy level is about 100 KeV. The regions 43 will not exist in the same form in the finished device, because silicon will be consumed in the field oxidation procedure. Usually the slice is subjected to a heat treatment after the boron implant but prior to field oxide growth, as set forth in my U.S. Pat. No. 4,055,444, assigned to Texas Instruments.

Figure 4:
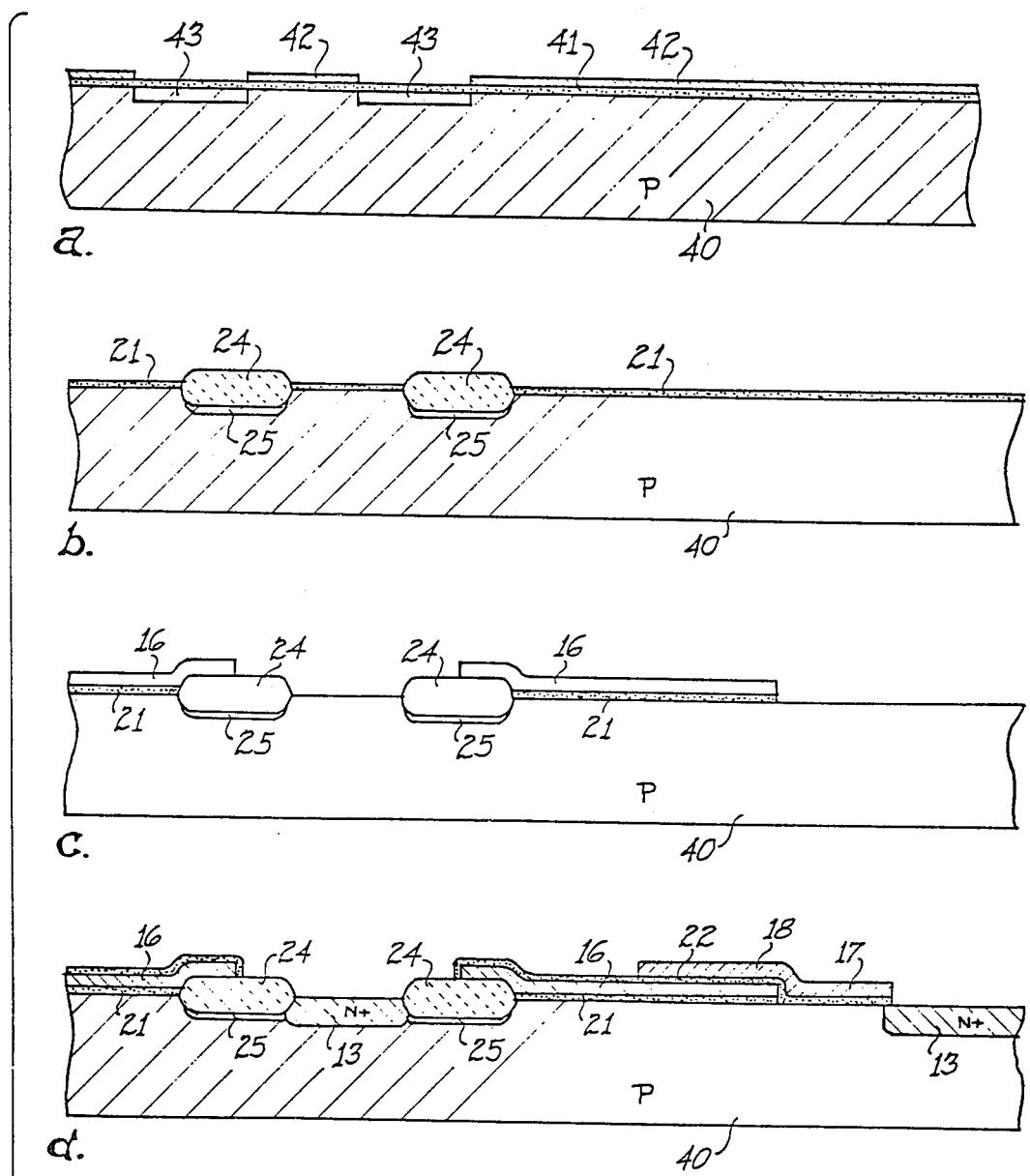
FIGS. 4a-4d are elevation views in section of the cell array of FIGS. 1 and 3a-3d, at successive stages in the manufacturing process, taken generally along the line a—a in FIG. 1.

The next step in the process is the formation of field oxide 24, by subjecting the slices to steam or an oxidizing atmosphere at about 900° to 1000° C. for several hours. This causes a thick field oxide layer 24 to be grown as seen in FIG. 4b, extending into the silicon surface as silicon is consumed upon oxidation. The remaining parts of the nitride layer 42 mask oxidation. The thickness of this layer 24 is about 10,000 Å, part of which is above the original surface and part below. The boron doped P+ regions 43 formed by implant are partly consumed, but also diffuse further into the silicon ahead of the oxidation front to produce reduced concentration P+ field stop regions 25 which are much deeper than the original regions 43.

Next the remaining nitride layer 42 is removed by an etchant which attacks nitride but not silicon oxide, then the oxide 41 is removed by etching and the exposed silicon cleaned. The first silicon oxide 21 is grown by thermal oxidation to a thickness of about 500 Å. In areas of the slice where depletion load devices are required, although not pertinent to this invention, a masked ion implant step would be done at this point. Likewise, the threshold voltage of the enhancement mode transistors in the cell array or in the periphery may be adjusted by another ion implant.

As seen in FIG. 4c, a first layer of polycrystalline silicon is deposited over the entire slice in a reactor using standard techniques to a thickness of about 5000 Å. This layer is doped with phosphorus by an N+ deposition to make it highly conductive. This first level polysilicon layer is patterned by applying a layer of photoresist, exposing to ultraviolet light through a mask prepared for this purpose, developing, then etching the exposed polysilicon to define the capacitor gates or strips 16 in the cell array.

The upper surface of the first level polysilicon as well as exposed silicon is oxidized by exposing the slice to an oxidizing atmosphere at 900° to 1000° C. to create the second thin thermal oxide layer 22 over the channels of the transistors 10 and over the capacitor gates 16 to a thickness of about 500 Å. A second level of polycrystalline silicon is next deposited over the slice using standard techniques, then doped N+ and masked by photoresist and etched to leave the segments 18 which also form the transistor gates 17. As seen in FIG. 4d, the slice is now subjected to an arsenic implant which creates the N+ regions 12 and 13, masked by the second level poly gate 17; a thermal oxide coating (not shown) is grown over exposed silicon and poly before this implant.

A thick layer 23 of silicon oxide is deposited by decomposition of silane at a low temperature, about 400° C. This layer 25 insulates the metal level from the layers of polycrystalline silicon, and is referred to as multilevel oxide.

Referring to FIGS. 1 and 3a–3d, the multilevel oxide layer 23 is now patterned by a photoresist operation, exposing the contact areas 19 for metal-to-polysilicon contacts along the bit lines 20 in the cell array (and contact areas for a metal-to-silicon or metal-to-poly contact for peripheral devices). Metal contacts and interconnections are used in the periphery of the chip in the input buffers, decoders, sense amplifiers, and the like, as well as for the bonding pads which provide connection to external electrodes. The metal contacts and interconnections are made in the usual manner by depositing a thin film of aluminum over the entire top surface of the slice then patterning it by a photoresist mask and etch sequence. This leaves the metal strips 20.

A thick protective oxide layer (not shown) covers the metallization, with aperatures etched in this layer above bonding pads. This layer is non-thermal oxide deposited at low temperature in accord with standard MOS manufacturing methods. Usually this covers everything except the bonding pads on a bar.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A method of making a dynamic semiconductor memory cell of the one-transistor type comprising the steps of:
    masking a face of a silicon body to expose field areas and cover transistor and capacitor areas,
    subjecting said face to an impurity ion implant at a dosage of not more than about $3 \times 10^{12}$ atoms per sq. cm. to produce implanted regions in said field areas but not in said transistor and capacitor areas,
    annealing said body in an inert atmosphere after said implant,
    thereafter growing field oxide in said field areas by exposing said face to an oxidizing atmosphere at high temperature thereby creating lightly doped channel stop regions from said implanted regions,
    forming electrodes at said transistor and capacitor areas to provide a memory cell, wherein the step of forming electrodes includes:
    applying a first layer of conductive material over said face of the semiconductor body to form a capacitor electrode overlying a first semiconductor region,
    applying a second layer of conductive material on said face partially overlying the first layer and overlying a second semiconductor region, the first and second semiconductor regions including said capacitor and transistor areas, respectively,
    applying a metal layer to said face to define at least one elongated strip overlying the first and second layers and making contact to at least one of said electrodes.

2. A method according to claim 1 wherein the body is P-type silicon, and heavily doped N+ regions are formed in said face, and the electrodes include conductive material which is polycrystalline silicon.

3. A method according to claim 2 wherein said implant is a P type impurity.

4. A method according to claim 3 wherein said step of masking employs a layer of silicon nitride which is patterned using photoresist.

5. A method according to claim 1 wherein the second layer is patterned to define a conductor segment for connection to the elongated strip which defines an address line.

6. A method according to claim 5 wherein the first layer is patterned to define a bias gate for the capacitor partially underlying the elongated strip.

7. A method according to claim 6 wherein a thick insulator separates said layer of metal from said face except at a contact window.

8. A method according to claim 7 wherein the coating field oxide formed on said face before applying said first conductive layer covers the face, except in the transistor and capacitor areas and an elongated heavily doped region.

9. A method according to claim 8 wherein an array of said cells is formed at said face, and the layer of metal includes parallel strips of metal, each strip contacting a plurality of pairs of cells in columns.

* * * * *